(12) United States Patent
Zhou et al.

(10) Patent No.: US 7,758,763 B2
(45) Date of Patent: Jul. 20, 2010

(54) PLASMA FOR RESIST REMOVAL AND FACET CONTROL OF UNDERLYING FEATURES

(75) Inventors: Yifeng Zhou, Sunnyvale, CA (US); Siyi Li, Fremont, CA (US); Terry Leung, Sunnyvale, CA (US); Michael D. Armacost, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 767 days.

(21) Appl. No.: 11/555,017

(22) Filed: Oct. 31, 2006

(65) Prior Publication Data

US 2008/0102645 A1  May 1, 2008

(51) Int. Cl.
*B44C 1/22* (2006.01)
*H01L 21/3065* (2006.01)

(52) U.S. Cl. .................. 216/67; 216/59; 438/710; 438/725

(58) Field of Classification Search ............ 216/59, 216/67; 438/710, 725
See application file for complete search history.

(56) References Cited

U.S. PATENT DOCUMENTS

| | | | |
|---|---|---|---|
| 4,659,852 A | 4/1987 | Shinohara et al. | |
| 4,705,597 A | 11/1987 | Gimpelson et al. | |
| 5,259,925 A | 11/1993 | Herrick et al. | |
| 5,338,398 A | 8/1994 | Szwejkowski et al. | |
| 5,658,829 A * | 8/1997 | Mathews et al. | 438/656 |
| 5,707,486 A | 1/1998 | Collins | |
| 5,821,169 A * | 10/1998 | Nguyen et al. | 438/736 |
| 5,873,948 A | 2/1999 | Kim | |
| 5,882,424 A | 3/1999 | Taylor et al. | |
| 6,008,139 A * | 12/1999 | Pan et al. | 438/730 |
| 6,035,803 A | 3/2000 | Robles et al. | |
| 6,036,878 A | 3/2000 | Collins | |
| 6,054,013 A | 4/2000 | Collins et al. | |
| 6,170,428 B1 | 1/2001 | Redeker et al. | |

(Continued)

FOREIGN PATENT DOCUMENTS

EP  0 721 514 B1  9/1999

(Continued)

OTHER PUBLICATIONS

Hutton, et al, "Plasma development of silylated bilayer resist," J. Vac. Sci. Technol. B 13(6) Nov./Dec. 1995 p. 2366-2371.

*Primary Examiner*—Shamim Ahmed
(74) *Attorney, Agent, or Firm*—Janah & Associates, P.C.

(57) ABSTRACT

A substrate comprising a resist layer overlying a dielectric feature, is processed in a substrate processing chamber comprising an antenna, and first and second process electrodes. A process gas comprising $CO_2$ is introduced into the chamber. The process gas is energized to form a plasma by applying a source voltage to the antenna, and by applying to the electrodes, a first bias voltage having a first frequency of at least about 10 MHz and a second bias voltage having a second frequency of less than about 4 MHz. The ratio of the power level of the first bias voltage to the second bias voltage is sufficient to obtain an edge facet height of the underlying dielectric feature that is at least about 10% of the height of the dielectric feature.

13 Claims, 5 Drawing Sheets

U.S. PATENT DOCUMENTS

| | | | |
|---|---|---|---|
| 6,345,589 B1 | 2/2002 | Ramiah et al. |
| 6,352,936 B1 | 3/2002 | Jehoul et al. |
| 6,387,819 B1 | 5/2002 | Yu |
| 6,444,084 B1 | 9/2002 | Collins |
| 6,528,751 B1 | 3/2003 | Hoffman et al. |
| 6,597,964 B1 | 7/2003 | Huang et al. |
| 6,649,532 B1 | 11/2003 | Chen et al. |
| 6,649,545 B2 | 11/2003 | Agarwal |
| 6,706,138 B2 | 3/2004 | Barnes et al. |
| 6,734,120 B1 | 5/2004 | Berry et al. |
| 6,767,698 B2 | 7/2004 | Johnson |
| 6,794,293 B2 | 9/2004 | Li et al. |
| 6,805,139 B1 | 10/2004 | Savas et al. |
| 6,848,455 B1 | 2/2005 | Shrinivasan et al. |
| 6,857,387 B1 | 2/2005 | Sun et al. |
| 6,909,195 B2 | 6/2005 | Li et al. |
| 6,991,739 B2 | 1/2006 | Kawaguchi et al. |
| 7,264,688 B1 | 9/2007 | Paterson et al. |
| 7,288,205 B2 | 10/2007 | Lakshmanan et al. |
| 7,326,872 B2 | 2/2008 | Shannon et al. |
| 7,359,177 B2 | 4/2008 | Yang et al. |
| 7,431,857 B2 | 10/2008 | Shannon et al. |
| 7,510,665 B2 | 3/2009 | Shannon et al. |
| 2002/0072016 A1 | 6/2002 | Chen et al. |
| 2004/0050406 A1 | 3/2004 | Seghal |
| 2005/0090118 A1 | 4/2005 | Shannon et al. |
| 2005/0133163 A1 | 6/2005 | Shannon et al. |
| 2005/0215445 A1 | 9/2005 | Boumerzoug et al. |
| 2006/0024968 A1 | 2/2006 | Hudson et al. |
| 2006/0134536 A1 | 6/2006 | Herchen |
| 2006/0163203 A1 | 7/2006 | Buie et al. |
| 2006/0175015 A1 | 8/2006 | Chen et al. |
| 2007/0212895 A1 | 9/2007 | Chua et al. |
| 2007/0243714 A1 | 10/2007 | Shin et al. |
| 2007/0249172 A1 | 10/2007 | Huang et al. |
| 2008/0102645 A1 | 5/2008 | Zhou et al. |
| 2008/0153306 A1 | 6/2008 | Cho et al. |
| 2008/0286979 A1 | 11/2008 | Shin et al. |

FOREIGN PATENT DOCUMENTS

| | | |
|---|---|---|
| WO | WO-99/16930 A1 | 4/1999 |
| WO | WO-0197270 A2 | 12/2001 |
| WO | WO-0215231 A2 | 2/2002 |
| WO | WO-0249078 A2 | 6/2002 |
| WO | WO-03/017318 A1 | 2/2003 |
| WO | WO-2004/034445 A2 | 4/2004 |
| WO | WO-2005/066997 A2 | 7/2005 |
| WO | WO-2007/106660 A2 | 9/2007 |

* cited by examiner

PLASMA FOR RESIST REMOVAL AND FACET CONTROL OF UNDERLYING FEATURES

BACKGROUND

Embodiments of the present invention relate to removing resist from a substrate while controlling properties of underlying features being etched on the substrate.

In substrate fabrication processes, semiconductor, dielectric and conductor materials are formed on a substrate and etched to form patterns of gates, vias, contact holes and interconnect features. These materials are typically formed by chemical vapor deposition (CVD), physical vapor deposition (PVD), oxidation and nitridation processes. For example, in CVD processes, a reactive gas is used to deposit a layer of material on the substrate, and in PVD processes, a target is sputtered to deposit material on the substrate. In oxidation and nitridation processes, a layer of oxide or nitride, typically silicon dioxide or silicon nitride, respectively, is formed by exposing the substrate to a suitable gaseous environment. In etching processes, a patterned etch-resistant mask of photoresist and/or a hard mask is formed on the substrate by photolithographic methods, and the exposed portions of the substrate are etched by an energized gas.

The dielectric layers on a substrate are etched in dielectric etching processes to form vias for contact holes. In the etching process, a resist layer is deposited over the dielectric layer and patterned by lithography to expose portions of the underlying dielectric material. Thereafter, the exposed portions of the dielectric layer are etched to form features on the substrate. After the etching process, residual resist remaining above the features is removed from the substrate in a process commonly known as resist stripping.

However, it is difficult to strip the overlying remnant resist without damaging the underlying dielectric features especially when both the resist and the underlying material contains the same element. Conventional resist stripping processes that remove the remnant photoresist which contains carbon by ashing the carbon in the resist in an energized plasma of oxygen, or oxygen and ammonia, damage the underlying etched features comprising a low k dielectric which also contains carbon. Conventional resist stripping plasma chemistries remove excessive amounts of this carbon from the underlying features, causing carbon depletion and increased porosity, which in turn undesirably increases the dielectric constant of the material. Further, the sidewalls can also be etched horizontally to provide narrower features of varying cross-section and undesirable wine-glass shaped profiles. It is desirable to maintain consistent critical dimensions and shapes for the etched dielectric features.

Another problem arises when attempting to control the edge facet height of the underlying low k dielectric features. This edge facet height is important because it controls the coverage of the copper barrier or seed layer coverage in subsequently conducted metal deposition processes. The desirable amount of edge facet is usually decided by integration. In conventional resist stripping processes, the edges and corners of the underlying dielectric features are often not sufficiently etched back to provide an undesirable cross-sectional profile of the dielectric feature that prevents subsequent uniform copper barrier or seed deposition into the hollow space between the dielectric features.

Therefore, it is desirable to be able to remove the remnant resist overlying etched dielectric features without damaging underlying etched dielectric features. It is further desirable to maintain good critical dimension control of these features. It is also desirable to control the edge facet height of the dielectric features.

DRAWINGS

These features, aspects and advantages of the present invention will become better understood with regard to the following description, appended claims and accompanying drawings, which illustrate exemplary features of the invention. However, it is to be understood that each of the features can be used in the invention in general, not merely in the context of the particular drawings, and the invention includes any combination of these features, where:

DESCRIPTION

Figure 1:
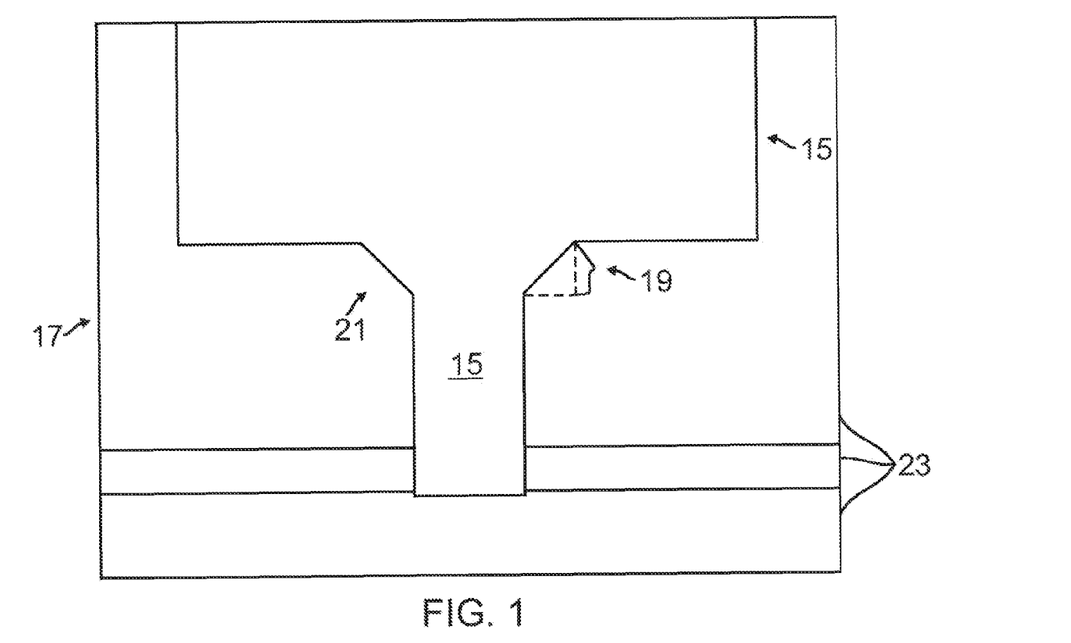
FIG. 1 is a schematic sectional side diagram of a substrate having multiples layers and a feature having an edge with a given edge facet height.

A substrate processing method removes a resist layer 10 formed above and overlying dielectric features 15 that have been etched on a substrate 17. The method removes the resist layer 10 from the etched features 15 while controlling an edge facet height 19 of the features 15. The resist layer 10 overlying the features 15 on the substrate 17 may comprise photoresist having a layer of thickness of from about 50 to about 1000 nanometers. The substrate 17 may comprise one or more layers 23 of material, as shown in FIG. 1, under the resist later 10. Such layers 23 are often superimposed on one another and may comprise, for example, carbon doped silicon oxide, porous carbon doped silicon oxide, silicon dioxide, undoped silicate glass, phosphosilicate glass (PSG), borophosphosilicate glass (BPSG), $Si_3N_4$, or TEOS deposited glass; semiconducting layers comprising, for example, silicon-containing layers such as polysilicon or a silicon compound; and conductive layers such as metal-containing layers comprising, for example, aluminum, copper, or metal silicide such as tungsten silicide and cobalt silicide. In one embodiment, the substrate 17 consists of a photoresist layer formed over an oxide hardmask, which is on top of a porous ultra low-k material (porous carbon doped silicon oxide) formed over a nitrogen doped silicon carbide barrier film. The thicknesses of the layers are of from about 50 nm to about 1000 nm, 20 nm to about 200 nm, 100 nm to about 2000 nm, and 10 nm to about 100 nm, respectively.

While the etching process described below is illustrated by exemplary process conditions and materials, it should be understood that the process can be applied to etching for various purposes, and the present invention should not be limited to these exemplary embodiments.

During processing, a substrate 17 to be etched to remove a resist layer 10 that overlies a dielectric feature 15, is placed in a substrate processing apparatus comprising a chamber which comprises an antenna and first and second process electrodes. To remove the resist layer 10 while controlling an edge facet height 19 of an underlying etched dielectric feature 15, a process gas is introduced into the chamber and energized inside of the chamber. The energized process gas comprises energized etching gas species, such as reactive dissociated and radical species, that are capable of etching the resist layer 10 on the substrate 17.

Figure 2A:
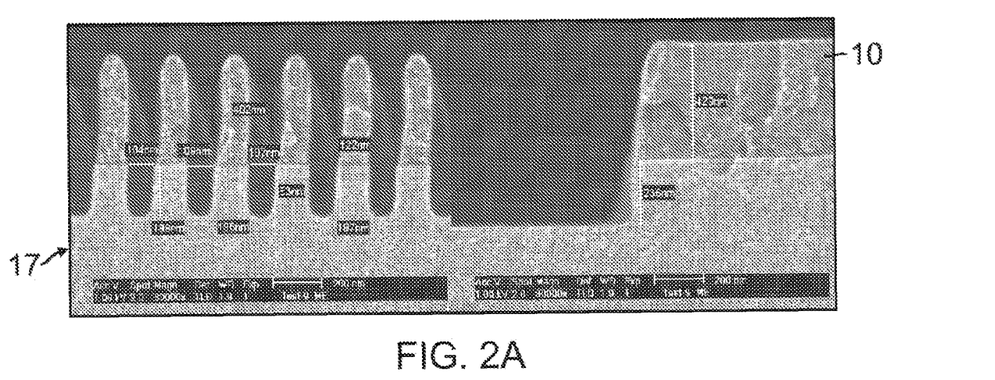
FIGS. 2A and 2B are scanning electron micrographs of the cross-section of a substrate showing (i) a remnant resist overlying etched dielectric features, and (ii) the features after the removal of the remnant resist with an energized process gas comprising carbon dioxide.
Figure 2B:
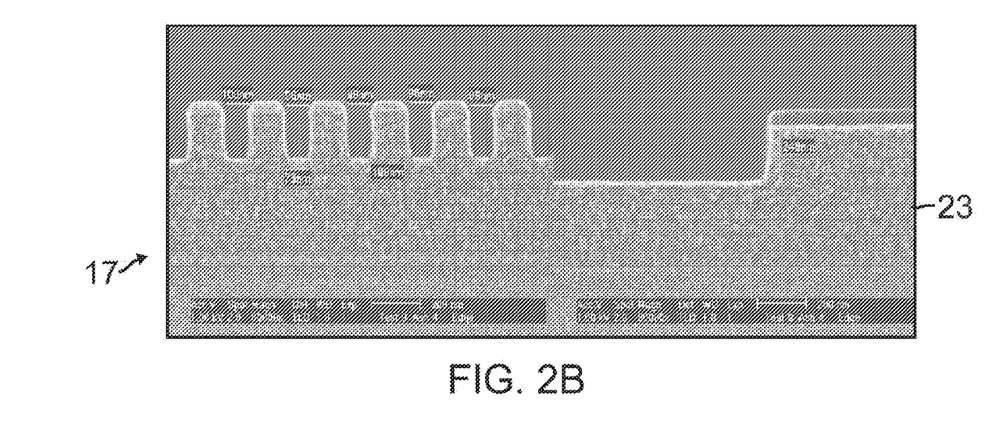

An example of a substrate processed in accordance with the present invention is shown in FIGS. 2A and 2B. In FIG. 2A, the substrate 17 comprises etch resistant material comprising the resist layer 10 overlying dielectric features 15. The resist layer 10 is resistant to etching by process gas which is introduced into a process zone under process conditions selected to etch into and/or through an underlying material, such as layers 23 of a substrate 17, to form desired features 15. The resist layer 10 may be patterned to expose portions of the underlying material for etching. Such patterning may be achieved by conventional photolithographic methods or by etching the resist material 10 in a process chamber. The etch resistant material may comprise resist material, such as polymeric or organic resist. In one embodiment, the etch resistant material comprises an organic, polymeric photoresist that is transparent to ultraviolet light frequencies and does not block incident light beams having wavelengths in the ultraviolet range. Alternatively or additionally, the etch resistant material may comprise mask material comprising, for example, a dielectric material or hard mask, such as silicon oxide, TEOS, silicon nitride, or equivalents. In one embodiment, the substrate 17 comprises an etch resistant material comprising a patterned resist material over a mask material.

The process gas introduced into the chamber comprises a composition of gases capable of being energized to etch through the resist layer 10 on the substrate 17 to expose the underlying etched dielectric features 15, as shown in FIG. 2B. A suitable process gas comprises carbon dioxide gas. In one embodiment, the percentage of carbon dioxide gas in the process gas is at least about 10%. In one embodiment, the process gas comprises carbon dioxide and either carbon monoxide or diatomic oxygen, where the percentage of carbon dioxide in the process gas is at least about 10%. In one embodiment, the process gas comprises carbon dioxide, diatomic nitrogen and either carbon monoxide or diatomic oxygen. In one embodiment, the process gas comprises carbon dioxide and one or more of carbon monoxide, diatomic oxygen, diatomic nitrogen, diatomic hydrogen and hydrogen dioxide. It is believed that the higher the percentage of carbon dioxide in the process gas, the more the resist layer 10 on the substrate 17 is bombarded with heavy carbon dioxide ions. More ion bombardment of the resist layer 10 overlying the dielectric feature 15 on the substrate 17 results in a greater edge facet height 19 of the feature 15.

Figure 4A:
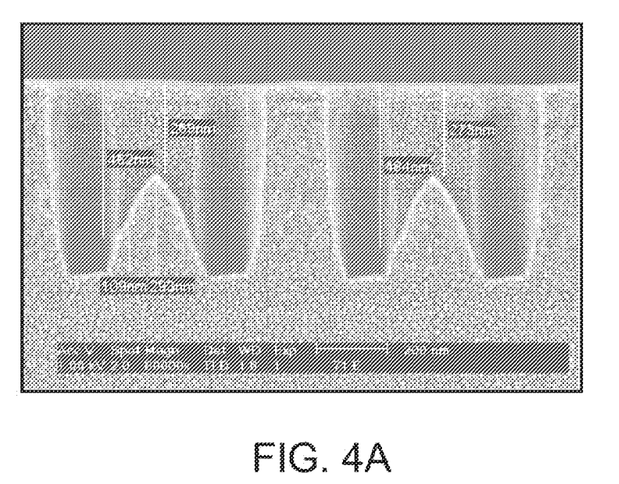
FIGS. 4A, 4B and 4C are scanning electron micrographs of the cross-section of a substrate showing the amount of vertical faceting achieved when the energized process gas was operated at (i) 10 mT, (ii) 20 mT and (iii) 40 mT.
Figure 4B:
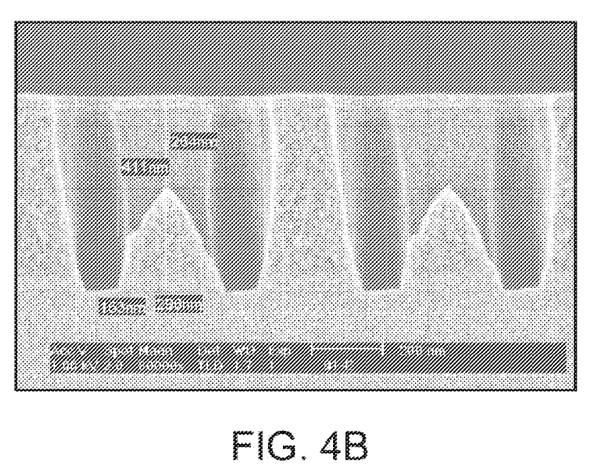
Figure 4C:
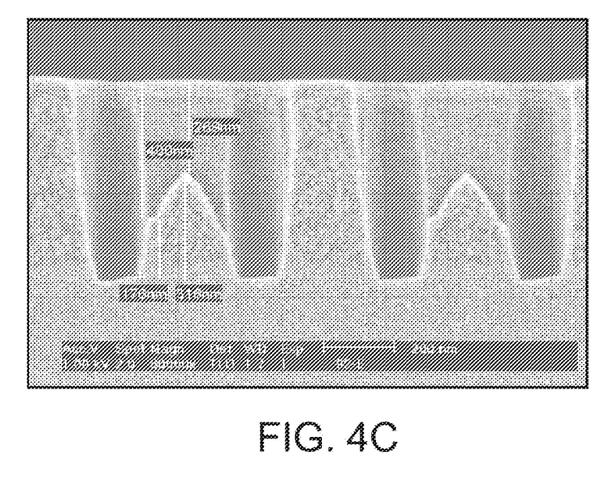

It has also been found that with lower gas pressure in the chamber, there is more ion bombardment of the resist layer 10 of the substrate 17 and consequently, a greater edge facet height 19 of a feature 15 is achieved. FIGS. 4A-4C show the percentage of vertical faceting achieved when the process gas is operated at 10, 20 and 40 mT, respectively. The corresponding percentages of vertical faceting for the edges 21 of these features 15 are 63%, 48% and 44%, respectively. In one embodiment, the process gas in the chamber is operated at a pressure of less than about 300 mT. In one embodiment, the process gas in the chamber is operated at a pressure of from about 5 to about 15 mT.

The process gas may be energized by inductively and/or capacitively coupling energy into the chamber. By "energized process gas" it is meant that the process gas is activated or energized so that one or more dissociated species, non-dissociated species, ionic species and neutral species are excited to higher energy states in which they are more chemically reactive. In the embodiment shown in FIG. 1, the process gas is energized by applying a source voltage, to an antenna generally adjacent to the ceiling of the chamber and by also applying first and second bias voltages to each of the process electrodes; for example, an overhead electrode and an electrode embedded in the substrate support. The source voltage and the bias voltages, may be, for example, an RF source voltage and RF bias voltages, respectively.

The first and second bias voltages applied to each of the process electrodes have different frequencies. The first bias voltage has a frequency of at least about 10 MHz and the second bias voltage has a frequency of less than about 4 MHz. The application of this ratio of power of the first bias voltage to the second bias voltage is sufficient to obtain an edge facet height 19 of the underlying etched dielectric feature 15, that is at least 10% of the height of the feature 15. In one embodiment, the ratio of the power level of the first bias voltage to the second bias voltage is at least about 1:9. The ratio of the power level of the first bias voltage to the second bias voltage controls the edge facet height 19 of the feature 15 because second bias voltage generates more high energy ions. In one embodiment, the ratio of the power level of the first bias voltage to the second bias voltage is less than about 11:1 and sufficiently low to obtain an edge facet height 19 of the underlying etched dielectric feature 15 that is at least 30% of the height of the dielectric feature 15. The ratio of the power level of the source voltage to the power level of the total of the first and second bias voltages is from about 0:1 to about 50:1.

A suitable source power level applied to the antenna may be, for example, from about 0 to about 1000 Watts and in one embodiment, about 200 Watts. The higher the total source power, the less vertical facet height is achieved at the edge 21 of the feature 15 on the substrate. In one embodiment, the source frequency applied to the antenna ranges from about 40 to about 200 MHz.

Figure 3A:
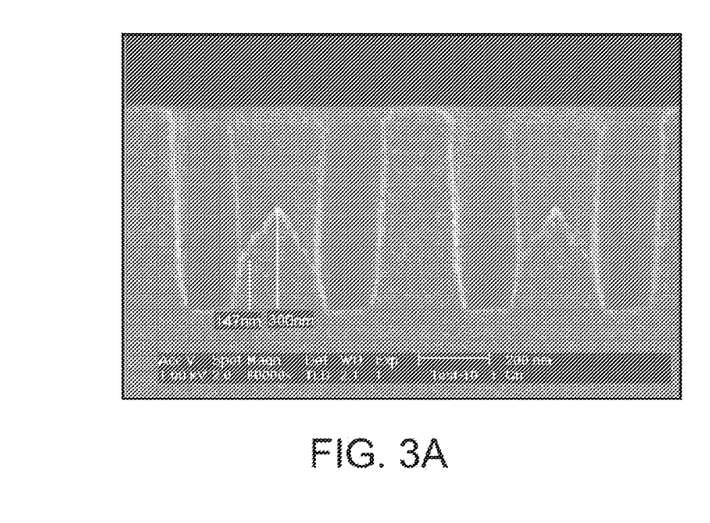
FIGS. 3A and 3B are scanning electron micrographs of the cross-section of a substrate showing the amount of vertical faceting achieved at (i) 200 Watts of total bias power and (ii) 500 Watts of total bias power.
Figure 3B:
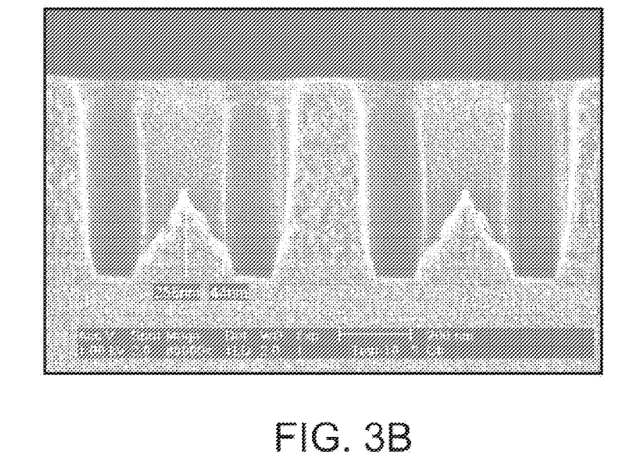

A suitable bias power level for the first voltage bias is in the range of from about 50 to about 1000 Watts and for the second voltage bias is in the range of about 50 to about 1000. It has been found that the higher the total bias power, the more vertical faceting is achieved or the greater the edge facet height 19 of the feature 15 on the substrate 17. FIGS. 3A and 3B show scanning electron micrographs of the cross-section of a substrate 17 showing the percentage of vertical faceting achieved at (i) 200 Watts of total bias power, which produced about 51% of faceting and (ii) 500 Watts of total bias power, which produced about 83% of faceting.

In one embodiment, the first bias frequency is from about 4 to about 20 MHz and the second bias frequency is from about 1 to about 4 MHz. In one embodiment, the first bias frequency is about 13.6 MHz and the second bias frequency is about 2 MHz.

The substrate 17 may be exposed to the energized process gas for a period of time of from about 10 to about 600 seconds, and the exposure time is dependent upon the amount of photo resist that needs to be removed. The energized process gas etches the resist layer 10 on the substrate 17 to form volatile gaseous species that are exhausted from the chamber by an exhaust system.

The endpoint of the etching process may be determined by a spectroscopic method. The endpoint of the etching stage may occur, for example, when the resist layer 10 of the substrate 17 has been sufficiently removed or etched through to reveal the underlying dielectric feature 15 on the substrate 17, and/or when a desired dimension, such as a specific edge facet height 19 of a feature 15, has been obtained. Determining the endpoint of the etching stage for resist removal allows for etching of the substrate 17 to be halted once completed, thereby reducing the occurrence of overetching or underetching of the substrate 17. The endpoint may be determined by monitoring radiation emissions from plasma in the chamber that emits radiation that changes in intensity and wavelength according to a change in the composition of the energized gas, such as for example, a change in composition arising from the etching through of an overlying layer to expose an underlying layer on the substrate 17. The radiation emissions are monitored by detecting the intensities of one or more wavelengths of the radiation emission. A signal is generated in relation to the detected intensities and the signal is analyzed, for example, by a controller, to determine a change in an intensity of one or more wavelengths of the radiation, such as an increase or decrease in the intensity that is indicative of the etching stage endpoint. The etching endpoint can also be determined by monitoring radiation that is reflected from the substrate 17 during the etching process.

The particular embodiment of the apparatus 100 described herein is suitable for processing substrates 17 such as semiconductor substrates, and may be adapted by those of ordinary skill to process other substrates 17 such as flat panel displays, polymer panels or other electrical circuit receiving structures. Thus, the apparatus 100 should not be used to limit the scope of the invention, nor its equivalents, to the exemplary embodiments provided herein.

Figure 5:
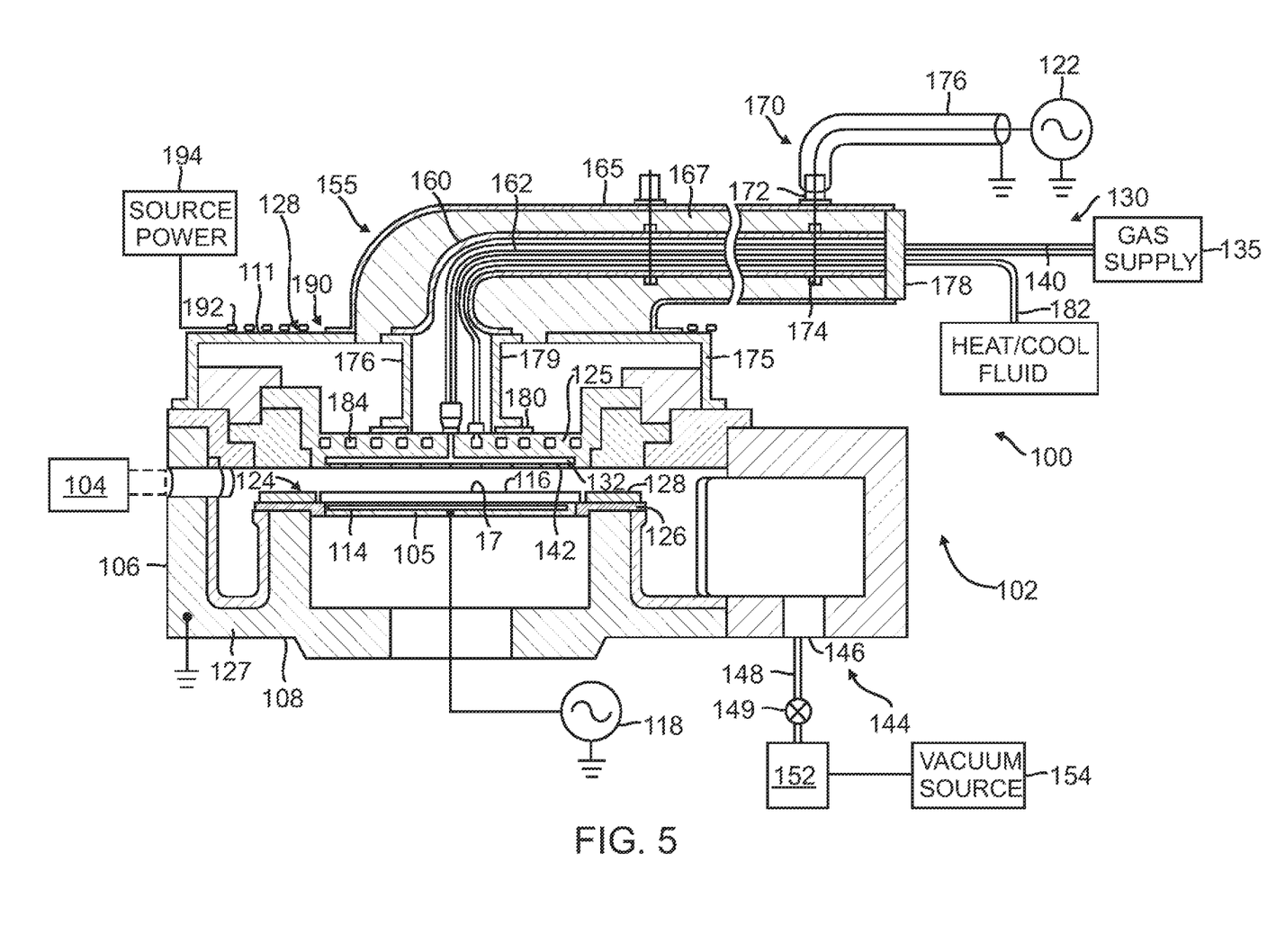
FIG. 5 is a cross-sectional view of a substrate processing chamber having an antenna and first and second process electrodes.

An embodiment of an apparatus 100 suitable for processing substrates 17 according to the processes described herein, is shown in FIG. 5. FIG. 5 provides a cross-sectional view of a substrate processing apparatus 100 known as the Enabler™ etch system, available from Applied Materials, Inc., Santa Clara, Calif., and as disclosed in U.S. Pat. No. 6,528,751 issued to Daniel Hoffman et al., the disclosure of which is incorporated herein by reference in its entirety. The substrate processing chamber 102 of the apparatus 100 is mounted on a platform (not shown) that provides electrical, plumbing, and other support functions. The platform typically supports a load lock chamber and a substrate transfer chamber. The load lock chamber receives a cassette of substrates 17 to be processed. The substrate transfer chamber contains a substrate transfer mechanism 104 such as a robot comprising a substrate blade, to transfer substrates 17 from the cassette to and from the different chambers on the platform, for processing. The chambers are interconnected in a vacuum environment so that processing of the substrates 17 may proceed uninterrupted within the apparatus 100, thereby reducing contamination of the substrates 17, that may otherwise occur when transferring the substrates 17 between separate chambers for different process stages.

The substrate processing apparatus 100 comprises a processing chamber 102 comprising enclosure walls that include sidewalls 106, a bottom 108, and a ceiling 111 disposed thereon; the enclosure walls forming an isolated processing environment. The sidewalls 106 of the chamber 102 may be isolated from the processing environment in the chamber 102 by using magnetic isolation. Alternatively, the sidewalls 102 may have a dielectric coating thereon, or an annular dielectric insert or removable liner may be disposed adjacent the sidewalls 102. Ceiling 111 comprises a flat surface.

Each chamber 102 further comprises a substrate support 105 to support a substrate 17 in the chamber 102. The substrate support 105 is generally formed from materials such as stainless steel, aluminum, or other materials that are electrically conductive and adapted to withstand substrate processing. The substrate support 105 typically comprises an electrostatic chuck comprising a dielectric body that at least partially covers an electrode 114 and which includes a substrate receiving surface 116. The electrode 114 may also serve as a process electrode. The electrode 114 may be capable of generating an electrostatic charge for electrostatically holding the substrate 17 to the electrostatic chuck. For example, the electrode 114 may be made, for example, from a metal such as tungsten, tantalum or molybdenum. A chucking voltage supply applies a DC chucking voltage to the electrode 114. To electrically bias plasma toward and away from the substrate support 105, a first electrical bias source 118 and second electrical bias source 122 may be coupled to the electrode 114.

A ring assembly 124 surrounds an outer edge of the substrate support 105. The ring assembly comprises a deposition ring 126 made of a dielectric such as quartz, and a cover ring 128. The deposition ring 126 is supported on the grounded chamber body 127 and the cover ring 128 is supported by the deposition ring 126.

In operation, process gas is introduced into the chamber 102 through a gas delivery system 130 that includes a gas distributor 132, a process gas supply 135 comprising gas sources with respective conduits each having a gas control valve, such as a mass flow controller, to pass a set flow rate of the respective gas therethrough. The conduits feed the gases to a mixing manifold in which the gases are mixed to form a desired process gas composition. The mixing manifold passes the mixed process gas through a metal gas line 140 to the gas distributor 32 having gas outlets 142 in the chamber 102.

Spent process gas and byproducts are exhausted from the chamber 102 through a gas exhaust 144. The exhaust 144 includes one or more exhaust ports 146 that receive spent process gas and pass the spent gas to an exhaust conduit 148 in which there is a throttle valve 149 to control the pressure of the gas in the chamber 102. The exhaust conduit feeds one or more exhaust pumps 152. The exhaust pump 152 is in fluid communication with a vacuum source 154 through a pumping valve (not shown). It is contemplated that the exhaust pump 152 may be a separate body coupled to the chamber 102 (as shown). In a gas purge or vacuum process, the pumping valve couples the vacuum source to the port 146 at a pressure desired for semiconductor processing while allowing for rapid removal of waste gases using a single vacuum source 154.

A coaxial stub 155 is attached to and in fluid connection with the ceiling 111 of the chamber 102. The stub 155 includes an inner cylindrical conductor 160 and an outer concentric cylindrical conductor 165. An insulator 167, preferably having a relative dielectric constant of 1, fills the space between the inner and outer conductors 160, 165. The inner and outer conductors 160, 165 are formed of nickel-coated aluminum. In one embodiment, the outer conductor 165 has a diameter of about 4.3 inches and the inner conductor 160 has a diameter of about 1.5 inches. The stub 155 characteristic impedance is determined by the radii of the inner and outer conductors 160, 165 and the dielectric constant of the insulator 167. The stub 155 in this embodiment, has a characteristic impedance of 65Ω. More generally, the stub 155 characteristic impedance exceeds the source power output impedance by about 20%-40% and preferably by about 30%. The stub 155 has an axial length of about 29 inches and a quarter wavelength at about 220 MHz, in order to have a resonance in the vicinity of 220 MHz to generally match while being slightly offset from the preferred VHF source power frequency of 210 MHz.

A tap 170 is provided at a particular point along the axial length of the stub 155 for applying RF power from the RF generator 122 to the stub 155. The RF power terminal 172 and the RF return terminal 174 of the generator 122 are connected at the tap 170 on the stub 155, to the inner and outer coaxial stub conductors 160, 165, respectively. These connections are made via a generator-to-stub coaxial cable 176 having a characteristic impedance that matches the output impedance of the generator 122, which is typically about 50Ω. A terminating conductor 178 at the far end of the stub 155 shorts the inner and outer conductors 160, 165 together, so that the stub 155 is shorted at its far end. At the near end of the stub, the unshorted end of the stub 155, the outer conductor 165 is connected to the chamber body via an annular conductive housing or support 175, while the inner conductor 160 is connected to the center of electrode 125 via a conductive cylinder or support 179. A dielectric ring 180, which in one embodiment has a thickness of about 1.3 inches and dielectric constant of 9, is held between and separates the conductive cylinder 179 and the electrode 125.

The inner conductor 160 provides a conduit 162 for the process gas and coolant. The principal advantage of this feature is that, unlike typical plasma reactors, the gas line 140 and the coolant line 182 do not cross large electrical potential differences. The gas line 140 and the coolant line 182 may therefore be constructed of metal, a less expensive and more reliable material for such a purpose. The metal gas line 140 feeds gas inlets 142 in or adjacent the overhead electrode 125 while the metallic coolant line 182 feeds coolant passages or jackets 184 within the overhead electrode 125.

The process gas is energized to process the substrate 17 by a gas energizer 188 that couples energy to the process gas in the chamber 102. The gas energizer 188 comprises an antenna 190 adjacent to the ceiling 111. The antenna 190 may be configured with RF coils 192 coupled to a source RF power generator 194 through a matching network (not shown), to inductively couple RF energy into the chamber 102.

The gas energizer 188 also comprises the electrode disposed within the substrate support 114 and the overhead electrode 125 spaced apart from the receiving surface 116 of the substrate support 105. Both the electrode 114 within the substrate support 105 and the overhead electrode 125 are each coupled to bias RF power generators 122 and 118 through an impedance matching network (not shown) and an isolation capacitor (not shown). The overhead electrode 125 comprising the dielectric ceiling serves as an induction field transmitting window that provides a low impedance to an RF induction field transmitted by the antenna 190 above the ceiling 111. Suitable dielectric materials that can be employed include materials such as aluminum oxide or silicon dioxide. The electrodes 114, 125 are electrically biased relative to one another by electrode voltage supply (not shown) that includes an AC voltage supply for providing an RF bias voltage. The RF bias voltage may comprise frequencies of about 50 kHz to about 60 MHz, and the power level of the RF bias current is typically from about 50 to about 3000 Watts.

The apparatus 100 may further comprise a process monitor (not shown) adapted to monitor a process being conducted in the chamber 102. The process monitor may be an interferometer or a plasma emission analyzer. The plasma emission analyzer typically receives a radiation emission emitted from a plasma in the process zone and analyzes the intensity of particular wavelengths of the emission spectra to determine an endpoint of a process. The interferometer detects radiation, such as light, that is interferometrically reflected from the surface layers on the substrate 17 to determine an end of processing of a layer. The reflected radiation may originate from a radiation source or from the plasma in the chamber 102. In one embodiment, the process monitor comprises a radiation source to direct a radiation beam toward the substrate 17. The incident radiation beam is reflected from the substrate 17 to form a reflected beam and a radiation detector receives the reflected beam to determine a property of the process or the substrate 17. The radiation may be light, such as infra-red, visible or ultraviolet light.

The chamber 102 may be operated by a controller 200 comprising a computer that sends instructions via a hardware interface to operate the chamber components, for example, the substrate support 105, the gas distributor 132, the gas energizer 188 and the gas exhaust 144. The process conditions and parameters measured by the different detectors in the chamber 102 are sent as feedback signals by control devices such as the gas flow control valves, pressure monitor (not shown), throttle valve 149, and other such devices, and are transmitted as electrical signals to the controller 200. Although, the controller 200 is illustrated by way of an exemplary single controller device to simplify the description of present invention, it should be understood that the controller 200 may be a plurality of controller devices that may be connected to one another or a plurality of controller devices that may be connected to different components of the chamber 102. Thus, the present invention should not be limited to the illustrative and exemplary embodiments described herein.

The controller 200 comprises electronic hardware including electrical circuitry comprising integrated circuits that are suitable for operating the chamber 102 and its peripheral components. Generally, the controller 200 is adapted to accept data input, run algorithms, produce useful output signals, detect data signals from the detectors and other chamber components, and to monitor or control the process conditions in the chamber 102. For example, the controller 200 may comprise a computer comprising (i) a central processing unit (CPU), such as for example, a conventional microprocessor from INTEL corporation, that is coupled to a memory that includes a removable storage medium, such as for example a CD or floppy drive, a non-removable storage medium, such as for example a hard drive or ROM, and RAM; (ii) application specific integrated circuits (ASICs) that are designed and preprogrammed for particular tasks, such as retrieval of data and other information from the chamber 102, or operation of particular chamber components; and (iii) interface boards that are used in specific signal processing tasks, comprising, for example, analog and digital input and output boards, communication interface boards and motor controller boards. The controller interface boards, may for example, process a signal from a process monitor and provide a data signal to the CPU. The computer also has support circuitry that include for example, co-processors, clock circuits, cache, power supplies and other well known components that are in communication with the CPU. The RAM can be used to store the software implementation of the present invention during process implementation. The instruction sets of code of the present invention are typically stored in storage mediums and are recalled for temporary storage in RAM when being executed by the CPU. The user interface between an operator and the controller 200 can be, for example, via a display (not shown) and a data input device 204, such as a keyboard or light pen. To select a particular screen or function, the operator enters the selection using the data input device 204 and can review the selection on the display.

The data signals received and evaluated by the controller 200 may be sent to a factory automation host computer (not shown). The factory automation host computer may comprise a host software program that evaluates data from several systems, platforms or chambers, and for batches of substrates 17 or over an extended period of time, to identify statistical process control parameters of (i) the processes conducted on the substrates 17, (ii) a property that may vary in a statistical relationship across a single substrate 17, or (iii) a property that may vary in a statistical relationship across a batch of substrates 17. The host software program may also use the data for ongoing in-situ process evaluations or for the control of other process parameters. A suitable host software program comprises a WORKSTREAM™ software program available from aforementioned Applied Materials. The factory automation host computer may be further adapted to provide instruction signals to (i) remove particular substrates 17 from the etching sequence, for example, if a substrate property is inadequate or does not fall within a statistically determined range of values, or if a process parameter deviates from an acceptable range; (ii) end processing in a particular chamber 102, or (iii) adjust process conditions upon a determination of an unsuitable property of the substrate 17 or process parameter. The factory automation host computer may also provide the instruction signal at the beginning or end of etching of the substrate 17 in response to evaluation of the data by the host software program.

In one embodiment, the controller 200 comprises a computer program 206 that is readable by the computer and may be stored in the memory, for example on the non-removable storage medium or on the removable storage medium. The computer program 206 generally comprises process control software comprising program code comprising instructions to operate the chamber and its components, process monitoring software to monitor the processes being performed in the chamber 102, safety systems software, and other control software. The computer program 206 may be written in any conventional programming language, such as for example, assembly language, C++, Pascal, or Fortran. Suitable program code is entered into a single file, or multiple files, using a conventional text editor and stored or embodied in computer-usable medium of the memory. If the entered code text is in a high level language, the code is compiled, and the resultant compiler code is then linked with an object code of pre-compiled library routines. To execute the linked, compiled object code, the user invokes the object code, causing the CPU to read and execute the code to perform the tasks identified in the program.

Figure 6:
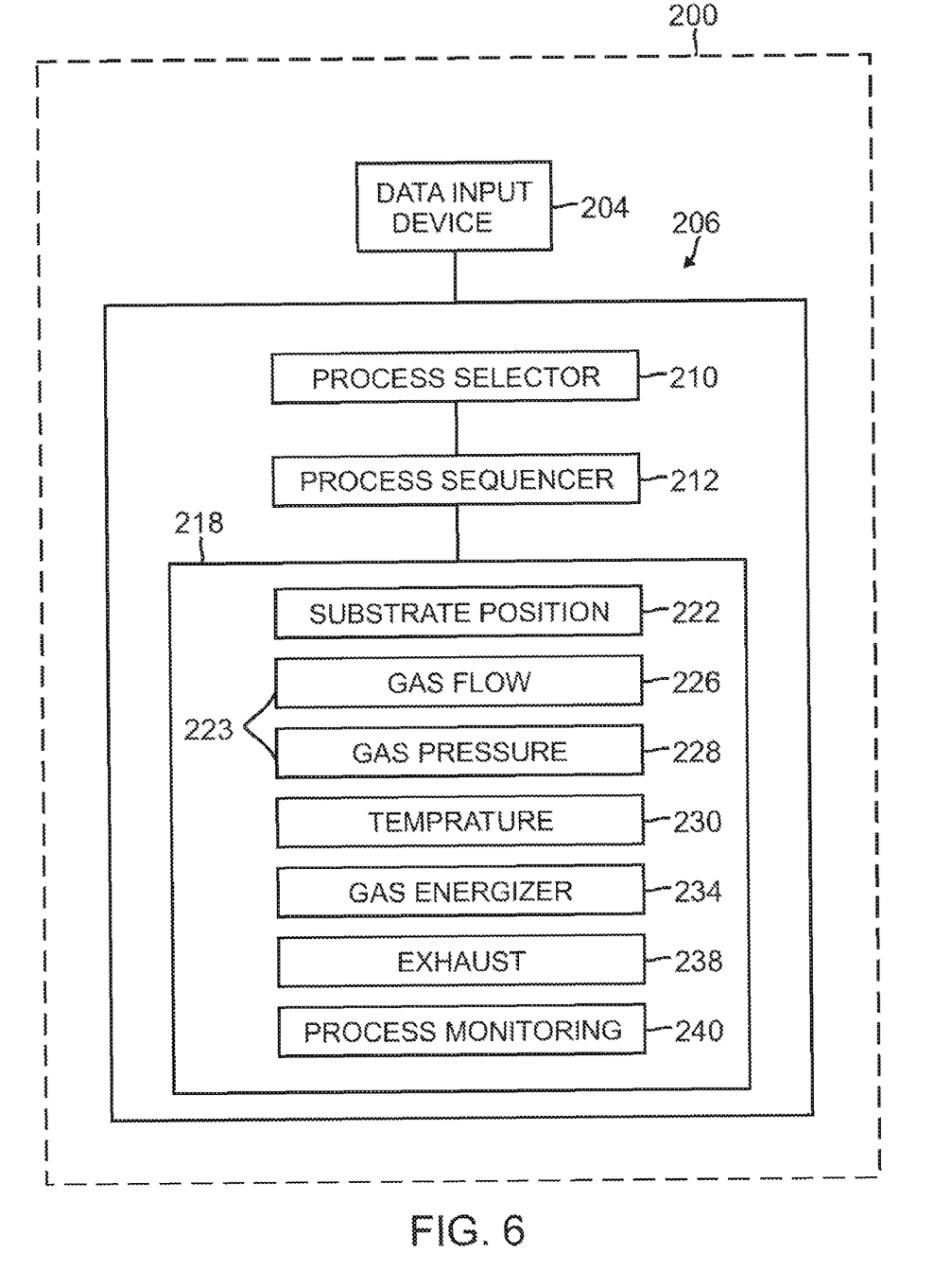
FIG. 6 is an illustrative block diagram of a structure of a computer program suitable for operating the process chamber of FIG. 5 and monitoring a process performed therein.

An illustrative block diagram of a hierarchical control structure of a specific embodiment of a computer program 206 according to the present invention is shown in FIG. 6. Using the data input device 204, for example, a user enters a process set into the computer program 206 in response to menus or screens on the display that are generated by a process selector 210. The computer program 206 includes instruction sets to control a substrate transfer mechanism (not shown), substrate support 105, gas distributor 132, gas exhaust 144, gas energizer 188, and other components involved in a particular process, as well as instructions sets to monitor the chamber process. The process sets are predetermined groups of process parameters necessary to carry out specified processes. The process parameters are process conditions, including without limitations, substrate position, gas composition, gas flow rates, temperature, pressure, and gas energizer settings such as RF or microwave power levels.

A process sequencer 212 comprises instruction sets to accept a set of process parameters from the computer program 206 or the process selector 210 and to control its operation. The process sequencer 212 initiates execution of the process set by passing the particular process parameters to a chamber manager 218 that controls multiple tasks in the chamber 102. The chamber manager 218 may include instruction sets, such as for example, substrate positioning instruction sets 222, gas distributor instruction sets 223 comprising gas flow control instruction sets 226 and gas pressure control instruction sets 228, temperature control instruction sets 230, gas energizer control instruction sets 234, gas exhaust control instruction sets 238 and process monitoring instruction sets 240.

The substrate positioning instruction sets 222 comprise, for example, substrate transfer mechanism instruction sets comprising code for controlling the substrate transfer mechanism 104 that is used to load and unload a substrate 17 from the support 105. The substrate positioning instruction sets 222 further comprise substrate support instruction sets comprising code to lift and lower a support 105 to a desired height in the chamber 102 and to lift and lower a substrate 17 from the receiving surface of the substrate support 105 to a raised position a distance of height above the receiving surface 116 of the substrate support 105 as well as lower the substrate 17 back down to contact or rest upon the substrate receiving surface 116 of the support 105.

The gas distributor instructions sets 223 comprise gas pressure control instruction sets 228 comprising program code for controlling the pressure in the chamber 102 by regulating the position of the throttle valve. For example, the position of the throttle valve is regulated by the extent to which the throttle valve is open or closed. The gas distributor instructions sets 223 further comprise gas flow control instruction sets 226 comprising code for controlling the flow rates of different constituents of the process gas. For example, the gas flow control instruction sets 226 may regulate the opening size of the gas flow control valves to obtain the desired gas flow rates to form the process which travels through line 170 to the gas outlets into the chamber 102. In one embodiment, the gas flow control instruction sets 226 comprise program code for setting the process gas flow rate at from about 100 to about 500 sccm. In one embodiment, the gas distributor instruction sets 223 comprise code to introduce a process gas comprising carbon dioxide gas into the chamber 102. In one embodiment, the gas distributor instruction sets 223 comprise program code to operate the gas distributor 132 to introduce a process gas comprising carbon dioxide and one or more of carbon monoxide, diatomic oxygen, diatomic nitrogen, diatomic hydrogen and hydrogen dioxide.

The temperature control instruction sets 230 comprise code for controlling the temperature of the substrate support 105 during etching, for example, by the gas filled lamps or the resistive heater in substrate support 105. The temperature control instruction sets 230 may further comprise code for controlling the temperature of the walls of the chamber 102, such as the temperature of the sidewalls 106 or ceiling 111.

The gas energizer control instruction sets 234 comprise code for applying a source voltage to the antenna 190. These instruction sets further comprise lines of code to operate the gas energizer 188 to apply to both the electrode 114 embedded in the substrate support 105 and the overhead electrode 125, a first bias voltage having a first frequency of at least about 10 MHz and a second bias voltage frequency of less than about 4 MHz. The ratio of the power level of the first bias voltage to the second bias voltage is sufficient to obtain an edge facet height of the underlying etched dielectric feature that is at least about 10% of the height of the feature 15. In one embodiment, the instructions comprise program code to operate the gas energizer 188 to set a ratio of the power level of the first bias voltage to the second bias voltage that is at least about 1:9. In one embodiment, the program code comprises instructions to operate the gas energizer 188 to set a ratio of the power level of the first bias voltage to the second bias voltage that is less than about 11:1 and sufficiently low to obtain an edge facet height 19 of the underlying etched dielectric feature 15 that is at least about 30% of the height of the dielectric feature 19. In one embodiment, the program code comprises instruction sets to operate the gas energizer 188 to set the first bias voltage to a power level of from about 50 to about 1000, and the second bias voltage to a power level of from about 50 to about 1000. In one embodiment, the program code comprises instruction sets to operate the gas energizer 188 to set the first frequency at about 13.6 MHz and the second frequency at about 2 MHz.

The gas exhaust control instruction sets 238 comprise code for operating the exhaust 144 to exhaust the spent process gas from the chamber 102.

The process monitoring instruction sets 240 may comprise program code to monitor a process in the chamber 102. For example, the process monitoring instruction sets may comprise program code to analyze a signal generated in relation to the detected intensities of wavelengths of radiation reflected from the substrate 17 or energized gas radiation emissions. The process monitoring instruction sets comprise program code to analyze a signal trace of the intensities of the wavelengths by counting the number of minima and maxima detected in the signal to determine the interference fringes in the measured reflected light beam and from that, the thickness of a layer on the substrate 17. The process monitoring instruction sets 240 may also comprise program code to analyze the signal and compare portions of the signal waveform to a stored characteristic waveform, or other representative pattern, to detect a characteristic feature indicative of the etching endpoint.

While described as separate instruction sets for performing a set of tasks, it should be understood that each of these instruction sets can be integrated with one another, or the tasks of one set of program code integrated with the tasks of another to perform the desired set of tasks. Thus, the controller 200 and the computer program 206 described herein should not be limited to the specific embodiment of the functional routines described herein; and any other set of routines or merged program code that perform equivalent sets of functions are also in the scope of the present invention. Also, while the controller 200 is illustrated with respect to one embodiment of the chamber 102, it may be compatible for use with other chambers.

Although the present invention has been described in considerable detail with regard to certain preferred embodiments thereof, other embodiments are possible. For example, the present invention could be used with etching gases other than those specifically mentioned, and could be used to etch other semiconductor and dielectric materials besides those mentioned. The process chamber 102 may also comprise other equivalent configurations as would be apparent to one of ordinary skill in the art. Further, it should be understood that the apparatus 100 as described above is not limited to an ENABLER™ chamber, as various types of substrate processing chambers may be used. Thus, the appended claims should not be limited to the description of the preferred embodiments contained herein.

What is claimed is:

1. A substrate processing method to remove a resist layer overlying a dielectric feature while controlling an edge facet height of the feature, the method performed in a substrate processing chamber comprising an antenna and first and second process electrodes, the method comprising:
   (a) placing a substrate having a resist layer overlying a dielectric feature into the chamber;
   (b) removing the resist layer while controlling an edge facet height of the underlying dielectric feature by:
      (i) introducing a process gas comprising $CO_2$ into the chamber;
      (ii) energizing the process gas by:
         (1) applying a source voltage to the antenna; and
         (2) applying to the first and second process electrodes in the chamber, a first bias voltage having a first frequency of at least about 10 MHz and a second bias voltage having a second frequency of less than about 4 MHz, the ratio of the power level of the first bias voltage to the second bias voltage being at least about 1:9 and less than about 11:1, to obtain an edge facet height of the underlying dielectric feature that is at least about 10% of the height of the dielectric feature; and
   (c) exhausting the process gas from the chamber.

2. A method according to claim 1 wherein the ratio of the power level of the first bias voltage to the second bias voltage is sufficiently low to obtain an edge facet height of the underlying dielectric feature that is at least about 30% of the height of the dielectric feature.

3. A method according to claim 1 wherein the first bias voltage is applied at a power level of from about 50 to about 1000 Watts.

4. A method according to claim 1 wherein the second bias voltage is applied at a power level of from about 50 to about 1000 Watts.

5. A method according to claim 1 wherein the first bias frequency is about 13.6 MHz and the second bias frequency is about 2 MHz.

6. A method according to claim 1 wherein the process gas further comprises CO or $O_2$.

7. A method according to claim 6 wherein the process gas further comprises $N_2$.

8. A method according to claim 1 wherein the percentage of $CO_2$ in the process gas is at least about 10%.

9. A method according to claim 1 wherein the process gas is maintained at a pressure of less than about 300 mT.

10. A method according to claim 1 wherein the process gas comprises one or more CO, $O_2$, $N_2$, $H_2$ and $H_2O$.

11. A method according to claim 6 wherein the percentage of $CO_2$ in the process gas is at least about 10%.

12. A method according to claim 1 wherein the source frequency is from about 40 to about 200 MHz.

13. A method according to claim 12 wherein the second frequency is from about 1 to about 4 MHz.

\* \* \* \* \*